United States Patent
Xi et al.

(10) Patent No.: US 11,151,959 B2
(45) Date of Patent: Oct. 19, 2021

(54) GOA CIRCUIT AND DISPLAY DEVICE

(71) Applicant: TCL CHINA STAR OPTOELECTRONICS TECHNOLOGY CO., LTD., Shenzhen (CN)

(72) Inventors: Suping Xi, Guangdong (CN); Tianhong Wang, Guangdong (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/772,647

(22) PCT Filed: Apr. 16, 2020

(86) PCT No.: PCT/CN2020/085078
§ 371 (c)(1),
(2) Date: Jun. 12, 2020

(87) PCT Pub. No.: WO2021/174649
PCT Pub. Date: Sep. 10, 2021

(65) Prior Publication Data
US 2021/0280147 A1    Sep. 9, 2021

(30) Foreign Application Priority Data

Mar. 4, 2020  (CN) .......................... 202010142656.2

(51) Int. Cl.
*G09G 3/36*    (2006.01)

(52) U.S. Cl.
CPC ......... *G09G 3/3696* (2013.01); *G09G 3/3677* (2013.01); *G09G 2310/08* (2013.01)

(58) Field of Classification Search
CPC combination set(s) only.
See application file for complete search history.

(56) References Cited

U.S. PATENT DOCUMENTS

| | | |
|---|---|---|
| 2016/0189649 A1 | 6/2016 | Xiao |
| 2016/0275886 A1 | 9/2016 | Dai et al. |
| 2016/0351152 A1* | 12/2016 | Dai ...................... H01L 29/7869 |
| 2017/0069286 A1* | 3/2017 | Wu ........................... G09G 3/20 |
| 2018/0046308 A1* | 2/2018 | Xiao ...................... G11C 19/28 |
| 2018/0211613 A1* | 7/2018 | Shi ........................... G09G 3/36 |
| 2018/0211614 A1* | 7/2018 | Shi ........................... G09G 3/36 |

(Continued)

FOREIGN PATENT DOCUMENTS

| CN | 103928007 A | 7/2014 |
|---|---|---|
| CN | 104537991 A | 4/2015 |

(Continued)

*Primary Examiner* — Van N Chow
(74) *Attorney, Agent, or Firm* — The Roy Gross Law Firm, LLC; Roy Gross (57) ABSTRACT

A GOA circuit and a display panel are provided. In the GOA circuit, a first clock signal, a second clock signal, and a nth stage clock signal are separated into an input terminal of a first unit and an input terminal of a second unit. This reduces time that a thin film transistor in an inverter is subjected to forward current stress, thereby reducing offset of a threshold voltage of the thin film transistor, improving stability of the thin film transistor, and ensuring a normal output of a scan signal waveform.

20 Claims, 2 Drawing Sheets

(56) References Cited

U.S. PATENT DOCUMENTS

| | | | |
|---|---|---|---|
| 2018/0293950 A1* | 10/2018 | Lv | ................. G09G 3/3677 |
| 2019/0043437 A1 | 2/2019 | Hao | |
| 2020/0273418 A1* | 8/2020 | Zhang | ................. G09G 3/3677 |

FOREIGN PATENT DOCUMENTS

| | | |
|---|---|---|
| CN | 206115985 U | 4/2017 |
| CN | 107424575 A | 12/2017 |
| CN | 107993627 A | 5/2018 |
| CN | 109935191 A | 6/2019 |

\* cited by examiner

GOA CIRCUIT AND DISPLAY DEVICE

FIELD OF INVENTION

The present invention relates to the field of display technologies, and more particularly to a GOA circuit and a display device.

BACKGROUND OF INVENTION

Gate driver on array (GOA) technology of an array substrate is to use current array substrate manufacturing process of a liquid crystal display panel to fabricate a gate driver circuit on a base substrate to realize a driving method of scanning the scan line by row.

Technical Problem

Figure 1:
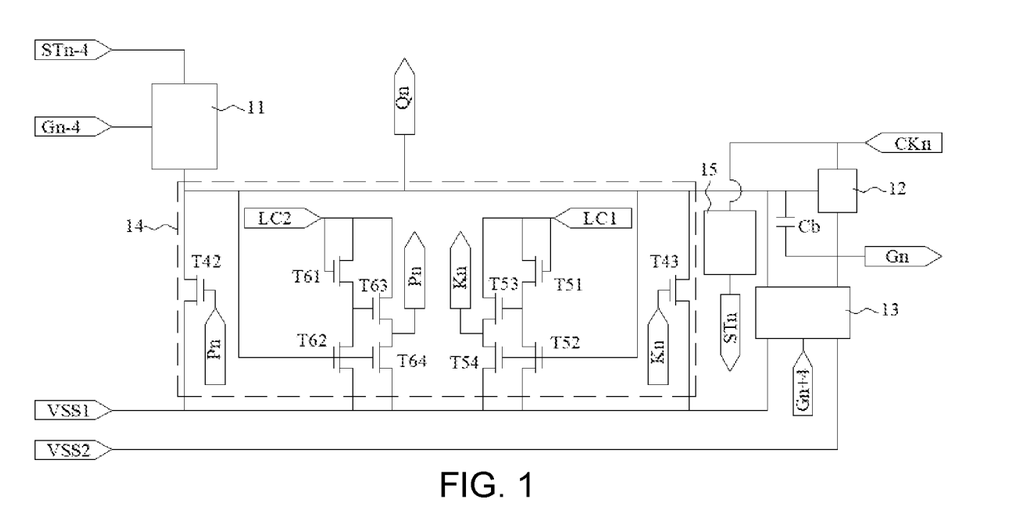
FIG. 1 is a schematic diagram of a current GOA circuit provided by the present disclosure.

Referring to FIG. 1, FIG. 1 is a schematic diagram of a current GOA circuit provided by the present disclosure. A nth stage GOA circuit unit includes a pull-up control circuit module 11, a pull-up circuit module 12, a pull-down circuit module 13, a pull-down maintenance circuit module 14, a signal conversion circuit module 15, and a bootstrap capacitor Cb. The pull-down maintenance circuit module 14 includes thin film transistors T42, T43, T51, T52, T53, T54, T61, T62, T63, T64. In order to make a waveform of a current stage scan signal Gn output by the GOA circuit unit normal, it is necessary to keep a potential of a first node Qn to be a normal potential. In order to make a waveform output by the first node Qn normal, it is necessary to ensure that the pull-down maintenance circuit module works normally. However, a gate and a drain of the thin film transistor T51 in the pull-down maintenance circuit module receive a nth stage clock signal CKn, and the CKn clock signal is a high-level signal. Therefore, a difference between a drain voltage and a source voltage of the thin film transistor T51 becomes larger. If the difference is larger, a forward current stress received by the thin film transistor T51 is also greater. A long-term impact of the forward current stress causes a threshold voltage of the thin-film transistor T51 to shift seriously, causing its electrical properties to be damaged or even fail. Similarly, the thin film transistor T61 has the same situation. In this way, the pull-down maintenance circuit module cannot work normally, so that an output waveform of the first node Qn will be seriously attenuated, thereby affecting a waveform output of the current stage scan signal Gn.

In summary, the thin-film transistors in the pull-down maintenance circuit module of the current GOA circuit are susceptible to severe threshold voltage shifts caused by the forward current stress and affecting the waveform output of the scan signal. Therefore, it is necessary to provide a GOA circuit and a display panel to improve this defect.

SUMMARY OF INVENTION

Embodiments of the present disclosure provide a GOA circuit and a display panel, which are used to solve an issue that thin film transistors in a pull-down maintenance circuit module of a current GOA circuit are susceptible to severe threshold voltage shifts caused by forward current stress and affect a waveform output of a scan signal.

An embodiment of the present disclosure provides a gate driver on array (GOA) circuit comprising a plurality of cascaded GOA circuit units, wherein a nth stage GOA circuit unit comprises a pull-down maintenance circuit module, a power supply low-voltage signal terminal, and a first node, where n is greater than 4 and n is a positive integer, the pull-down maintenance circuit module comprises: an inverter comprising a first unit, a second unit, and a first thin film transistor, wherein the first unit and the second unit comprise a plurality of thin film transistors, a gate of the first thin film transistor is connected to the first node, a first terminal of the first thin film transistor is connected to the power supply low-voltage signal terminal, a second terminal of the first thin film transistor, the first unit, and the second unit are connected to a second node, an input terminal of the first unit is connected to a first clock signal and a nth stage clock signal, and an input terminal of the second unit is connected to a second clock signal and the nth stage clock signal; and a voltage stabilizing unit connected to the first node, the power supply low-voltage signal terminal, and the second node, wherein the inverter uses a potential of the first node as an input signal and uses a potential of the second node as an output signal to control the voltage stabilizing unit to stabilize the potential of the first node.

In an embodiment of the present disclosure, the first unit comprises a second thin film transistor and a third thin film transistor, the second unit comprises a fourth thin film transistor and a fifth thin film transistor, a gate of the second thin film transistor is connected to the first clock signal, a gate of the fourth thin film transistor is connected to the second clock signal, a first terminal of the second thin film transistor, a first terminal of the third thin film transistor, a first terminal of the fourth thin film transistor, and a first terminal of the fifth thin film transistor are connected to the nth stage clock signal, and a second terminal of the third thin film transistor and a second terminal of the fifth thin film transistor are connected to the second node.

In an embodiment of the present disclosure, the first unit further comprises a sixth thin film transistor, and the second unit further comprises a seventh thin film transistor, a gate of the sixth thin film transistor and a gate of the seventh thin film transistor are connected to the first node, a first terminal of the sixth thin film transistor is connected to a second terminal of the second thin film transistor and a gate of the third thin film transistor, a first terminal of the seventh thin film transistor is connected to a second terminal of the fourth thin film transistor and a gate of the fifth thin film transistor, and a second terminal of the sixth thin film transistor and a second terminal of the seventh thin film transistor are connected to the power supply voltage signal terminal.

In an embodiment of the present disclosure, the voltage stabilizing unit comprises an eighth thin film transistor, a gate of the eighth thin film transistor is connected to the second node, and a first terminal of the eight thin film transistor is connected to the power supply low-voltage signal terminal, and a second terminal of the eighth thin film transistor is connected to the first node.

In an embodiment of the present disclosure, the first clock signal and the second clock signal have opposite phases.

In an embodiment of the present disclosure, each stage of the GOA circuit unit comprises a pull-up control circuit module, a pull-up circuit module, a signal conversion circuit module, and a pull-down circuit module, in the nth stage GOA circuit unit: the pull-up control circuit module is connected to the first node and is configured to receive a n−4th stage transmission signal and a n−4th stage scan signal; the pull-up circuit module is connected to the first node and a nth stage scan signal output terminal and is configured to receive the nth stage clock signal; the signal conversion circuit module is configured to receive the nth stage clock signal and output the nth stage transmission signal; the pull-down circuit module is connected to the first node, the nth stage scan signal output terminal and the power low-voltage signal terminal and is configured to receive a n+4th stage scan signal.

In an embodiment of the present disclosure, in first stage to fourth stage GOA circuit units, the pull-up control circuit unit is configured to receive a circuit start signal.

In an embodiment of the present disclosure, the GOA circuit unit further comprises a bootstrap capacitor connected to the first node and the nth scan signal output terminal.

In an embodiment of the present disclosure, the thin film transistor in the GOA circuit is at least one of an amorphous silicon thin film transistor and an indium gallium zinc oxide thin film transistor.

An embodiment of the present disclosure provides a display panel, comprising a plurality of rows of pixels and a GOA circuit. The GOA circuit comprises a plurality of cascaded GOA circuit units, each row of the pixels is connected to a corresponding GOA circuit unit in the GOA circuit and is driven by the GOA circuit unit, a nth stage GOA circuit unit comprises a pull-down maintenance circuit module, a power supply low-voltage signal terminal, and a first node, where n is greater than 4 and n is a positive integer, the pull-down maintenance circuit module comprises: an inverter comprising a first unit, a second unit, and a first thin film transistor, wherein the first unit and the second unit comprise a plurality of thin film transistors, a gate of the first thin film transistor is connected to the first node, a first terminal of the first thin film transistor is connected to the power supply low-voltage signal terminal, a second terminal of the first thin film transistor, the first unit, and the second unit are connected to a second node, an input terminal of the first unit is connected to a first clock signal and a nth stage clock signal, and an input terminal of the second unit is connected to a second clock signal and the nth stage clock signal; and a voltage stabilizing unit connected to the first node, the power supply low-voltage signal terminal, and the second node, wherein the inverter uses a potential of the first node as an input signal and uses a potential of the second node as an output signal to control the voltage stabilizing unit to stabilize the potential of the first node.

In an embodiment of the present disclosure, the first unit comprises a second thin film transistor and a third thin film transistor, the second unit comprises a fourth thin film transistor and a fifth thin film transistor, a gate of the second thin film transistor is connected to the first clock signal, a gate of the fourth thin film transistor is connected to the second clock signal, a first terminal of the second thin film transistor, a first terminal of the third thin film transistor, a first terminal of the fourth thin film transistor, and a first terminal of the fifth thin film transistor are connected to the nth stage clock signal, and a second terminal of the third thin film transistor and a second terminal of the fifth thin film transistor are connected to the second node.

In an embodiment of the present disclosure, the first unit further comprises a sixth thin film transistor, and the second unit further comprises a seventh thin film transistor, a gate of the sixth thin film transistor and a gate of the seventh thin film transistor are connected to the first node, a first terminal of the sixth thin film transistor is connected to a second terminal of the second thin film transistor and a gate of the third thin film transistor, a first terminal of the seventh thin film transistor is connected to a second terminal of the fourth thin film transistor and a gate of the fifth thin film transistor, and a second terminal of the sixth thin film transistor and a second terminal of the seventh thin film transistor are connected to the power supply voltage signal terminal.

In an embodiment of the present disclosure, the voltage stabilizing unit comprises an eighth thin film transistor, a gate of the eighth thin film transistor is connected to the second node, and a first terminal of the eight thin film transistor is connected to the power supply low-voltage signal terminal, and a second terminal of the eighth thin film transistor is connected to the first node.

In an embodiment of the present disclosure, the first clock signal and the second clock signal have opposite phases.

In an embodiment of the present disclosure, each stage of the GOA circuit unit comprises a pull-up control circuit module, a pull-up circuit module, a signal conversion circuit module, and a pull-down circuit module, in the nth stage GOA circuit unit: the pull-up control circuit module is connected to the first node and is configured to receive a n−4th stage transmission signal and a n−4th stage scan signal; the pull-up circuit module is connected to the first node and a nth stage scan signal output terminal and is configured to receive the nth stage clock signal; the signal conversion circuit module is configured to receive the nth stage clock signal and output the nth stage transmission signal; the pull-down circuit module is connected to the first node, the nth stage scan signal output terminal and the power low-voltage signal terminal and is configured to receive a n+4th stage scan signal.

In an embodiment of the present disclosure, in first stage to fourth stage GOA circuit units, the pull-up control circuit unit is configured to receive a circuit start signal.

In an embodiment of the present disclosure, the GOA circuit unit further comprises a bootstrap capacitor connected to the first node and the nth scan signal output terminal.

In an embodiment of the present disclosure, the thin film transistor in the GOA circuit is at least one of an amorphous silicon thin film transistor and an indium gallium zinc oxide thin film transistor.

An embodiment of the present disclosure provides a display panel comprising a plurality of rows of pixels and a GOA circuit. The GOA circuit comprises a plurality of cascaded GOA circuit units, each row of the pixels is connected to a corresponding GOA circuit unit in the GOA circuit and is driven by the GOA circuit unit, a nth stage GOA circuit unit comprises a pull-down maintenance circuit module, a power supply low-voltage signal terminal, and a first node, where n is greater than 4 and n is a positive integer, the pull-down maintenance circuit module comprises: an inverter comprising a first unit, a second unit, and a first thin film transistor, the first unit comprises a second thin film transistor and a third thin film transistor, the second unit comprises a fourth thin film transistor and a fifth thin film transistor, a gate of the first thin film transistor is connected to the first node, a first terminal of the first thin film transistor is connected to the power supply low-voltage signal terminal, a gate of the second thin film transistor is connected to the first clock signal having a phase opposite to a phase of the first clock signal, a first terminal of the second thin film transistor, a first terminal of the third thin film transistor, a first terminal of the fourth thin film transistor, and a first terminal of the fifth thin film transistor are connected to the nth stage clock signal, and a second terminal of the third thin film transistor, a second terminal of the fifth thin film transistor, and a second terminal of the first thin film transistor are connected to the second node; and a voltage stabilizing unit connected to the first node, the power supply low-voltage signal terminal, and the second node, wherein the inverter uses a potential of the first node as an input signal and uses a potential of the second node as an output signal to control the voltage stabilizing unit to stabilize the potential of the first node.

In an embodiment of the present disclosure, the first unit further comprises a sixth thin film transistor, and the second unit further comprises a seventh thin film transistor, a gate of the sixth thin film transistor and a gate of the seventh thin film transistor are connected to the first node, a first terminal of the sixth thin film transistor is connected to a second terminal of the second thin film transistor and a gate of the third thin film transistor, a first terminal of the seventh thin film transistor is connected to a second terminal of the fourth thin film transistor and a gate of the fifth thin film transistor, and a second terminal of the sixth thin film transistor and a second terminal of the seventh thin film transistor are connected to the power supply voltage signal terminal.

Beneficial Effect

In a GOA circuit of embodiments of the present disclosure, a first clock signal, a second clock signal, and a nth stage clock signal are separated into an input terminal of a first unit and an input terminal of a second unit. This reduces time that thin film transistors in the first unit and the second unit are subjected to forward current stress, thereby reducing offset of threshold voltages of the thin film transistors, improving stability of the thin film transistors, and ensuring a normal output of a scan signal waveform. In addition, the first thin film transistor is used to connect the first unit and the second unit to the second node, so as to effectively simplify a number of thin film transistors, thereby reducing space occupied by the GOA circuit.

DESCRIPTION OF DRAWINGS

In order to more clearly explain the embodiments or the technical solutions in the prior art, the following will briefly introduce the drawings used in the description of the embodiments or the prior art. Obviously, the drawings in the following description are only disclosed For some embodiments, those of ordinary skill in the art can obtain other drawings based on these drawings without creative efforts.

DETAILED DESCRIPTION OF PREFERRED EMBODIMENTS

The following descriptions of the embodiments refer to the attached drawings to illustrate specific embodiments of the present invention that can be implemented. Directional terms mentioned in the present invention, such as "up", "down", "front", "rear", "left", "right", "inner", "outer", "side", etc., just refer to the directions of the attached drawings. Therefore, the directional terminology is used to illustrate and understand the present invention, not to limit the present invention. In the figure, units with similar structures are indicated by the same reference numerals.

Figure 2:
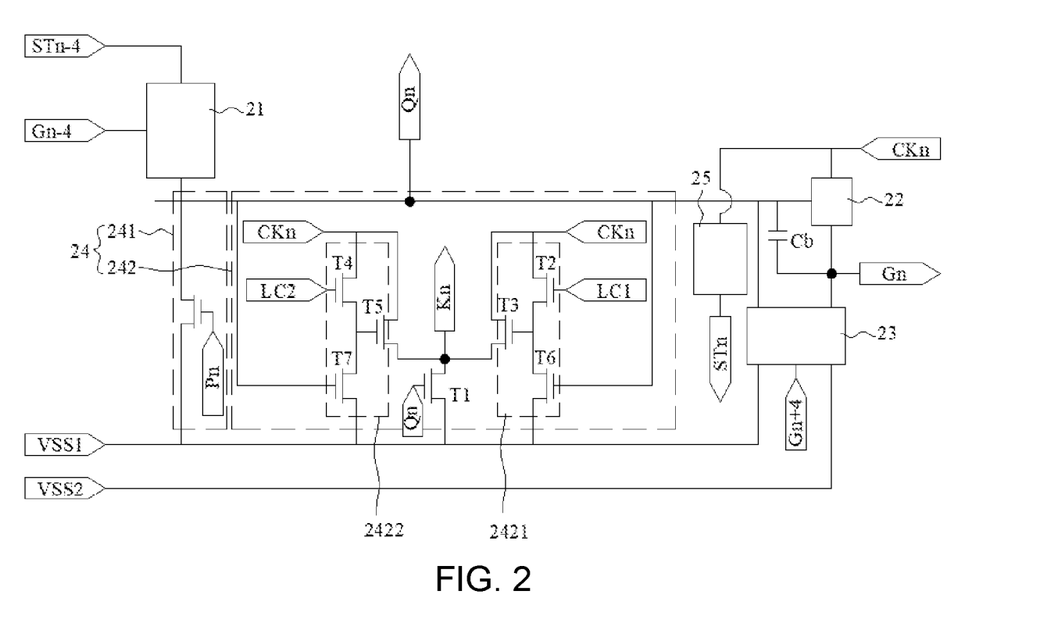
FIG. 2 is a schematic diagram of a GOA circuit provided by an embodiment of the present disclosure.

The present disclosure is further described below in conjunction with the drawings and specific embodiments:

An embodiment of the present disclosure provides a GOA circuit, which will be described in detail below with reference to FIG. 2. As shown in FIG. 2, FIG. 2 is a schematic diagram of a GOA circuit provided by an embodiment of the present disclosure. The GOA circuit includes multiple cascaded GOA circuit units. Each stage of the GOA circuit unit includes a pull-up control circuit module 21, a pull-up circuit module 22, a pull-down circuit module 23, a pull-down maintenance circuit module 24, a signal conversion circuit module 25, and a power supply low-voltage signal terminal VSS. The power low-voltage signal terminal VSS includes a first power low-voltage signal terminal VSS1 and a second power low-voltage signal terminal VSS2.

In a nth stage GOA circuit unit, n is greater than 4, and n is a positive integer. The pull-down maintenance circuit module 24 includes a voltage stabilizing unit 241 and an inverter 242. The voltage stabilizing unit 241 is connected to a first node Qn, the first power low-voltage signal terminal VSS1, and a second node Kn. The inverter 242 is connected to the first node Qn and the first power low-voltage signal terminal VSS1, and is configured to use a potential of the first node Qn as an input signal and a potential of the second node Kn as an output signal to control the voltage stabilizing unit 241 so that the potential of the first node Qn is stable.

Specifically, the inverter 242 includes a first unit 2421, a second unit 2422, and a first thin film transistor T1. The first unit 2421 and the second unit 2422 each include a plurality of thin film transistors. A gate of the first thin film transistor T1 is connected to the first node Qn. A first terminal of the first thin-film transistor T1 is connected to the first power low-voltage signal terminal VSS1. A second terminal of the first thin film transistor T1, the first unit 2421, and the second unit 2422 are connected to the second node Kn.

An input terminal of the first unit 2421 is configured to receive a first clock signal LC1 and a nth stage clock signal CKn. An input terminal of the second unit 2422 is configured to receive a second clock signal LC2 and a nth stage clock signal CKn. By separately feeding the first clock signal LC1 and the nth stage clock signal CKn, time during which the thin film transistor in the first unit 2421 is subjected to forward current stress can be reduced. Therefore, shift of a threshold voltage of the thin film transistor is reduced, so that a waveform output by the first node Qn is stable and normal. Similarly, a structure of the second unit 2422 is the same as a structure of the first unit 2421, and the same technical effects as the first unit 2421 can also be achieved. In addition, the first unit 2421 and the second unit 2422 are connected through the first thin film transistor T1 to form a group of inverters. Based on maintaining original functions, a number of thin film transistors in the inverter 24 can be effectively reduced, thereby reducing space occupied by the GOA circuit unit.

Further, the first unit 2421 includes a second thin film transistor T2 and a third thin film transistor T3. The second unit 2422 includes a fourth thin film transistor T4 and a fifth thin film transistor T5 as shown in FIG. 2. A gate of the second thin film transistor T2 is configured to receive the first clock signal LC1. A first terminal of the second thin film transistor T2 and a first terminal of the third thin film transistor T3 are both configured to receive the nth stage clock signal CKn. A gate of the fourth thin film transistor T4 is configured to receive the second clock signal LC2. A first terminal of the fourth thin film transistor T4 and a first terminal of the fifth thin film transistor T5 are both configured to receive the nth stage clock signal CKn. A second terminal of the third thin film transistor T3 and a second terminal of the fifth thin film transistor T5 are both connected to the second node Kn.

The first unit 2421 also includes a sixth thin film transistor T6. The second unit 2422 also includes a seventh thin film transistor T7. A gate of the sixth thin film transistor T6 and a gate of the seventh thin film transistor T7 are both connected to the first node Qn. A first terminal of the sixth thin film transistor T6 is connected to a second terminal of the second thin film transistor T2 and a gate of the third thin film transistor T3. A first terminal of the seventh thin film transistor T7 is connected to a second terminal of the fourth thin film transistor T4 and a gate of the fifth thin film transistor T5. A second terminal of the sixth thin film transistor T6 and a second terminal of the seventh thin film transistor T7 are both connected to the first power supply low voltage signal terminal VSS1.

Specifically, the voltage stabilizing unit 241 includes an eighth thin film transistor T8. A gate of the eighth thin film transistor T8 is connected to the second node Kn, a first terminal thereof is connected to the first power low-voltage signal terminal VSS1, and a second terminal thereof is connected to the first node Qn.

Taking the first clock signal LC1 as an example, when a potential of the first clock signal LC1 is high and a potential of the first node Qn is high, if a potential of the nth stage clock signal CKn is high, the second thin film transistor T2 and the sixth thin film transistor T6 are turned on. According to a ratio, the third thin film transistor T3 is turned off. At this time, the second node Kn outputs a low potential, the eighth thin film transistor T8 is turned off, and the first node Qn still maintains a high potential. If the nth stage clock signal CKn is at a low potential, the second thin film transistor T2 and the sixth thin film transistor T6 are turned on, and at this time, the gate of the third thin film transistor T3 is at a low potential. That is, the potential of the second node Kn is also a low potential, the eighth thin film transistor T8 is turned off, and the first node Qn still maintains a high potential.

When a potential of the first clock signal LC1 is high and a potential of the first node Qn is low, if a potential of the nth stage clock signal CKn is high, the second thin film transistor T2 is turned on, the sixth thin film transistor T6 is turned off, and the third thin film transistor T3 is turned on. At this time, the second node Kn outputs a high potential, the eighth thin film transistor T8 is turned on, and the first node Qn is pulled down to a low potential. That is, the first node Qn maintains a low potential. If the nth stage clock signal CKn is at a low potential, the second thin film transistor T1 is turned on, the sixth thin film transistor T6 is turned off, the gate of the third thin film transistor T3 still maintains a high potential, and the third thin film transistor T3 is turned on. At this time, the second node Kn outputs a high potential, the eighth thin film transistor T8 is turned on, and the first node Qn is pulled down to a low potential. That is, the first node Qn maintains a low potential. If the nth stage clock signal CKn is at a high potential, both the second thin film transistor T2 and the sixth thin film transistor T6 are turned off, the second node CKn maintains a high potential, the eighth thin film transistor T8 is turned on, and the first node Qn continues to maintain a low potential. That is, when the first clock signal LC1 is at a high potential, the first unit 2421 can effectively maintain the potential of the first node Qn.

In an embodiment of the present disclosure, phases of the first clock signal LC1 and the second clock signal LC2 are opposite. A structure of the first unit 2421 and a structure of the second unit 2422 in the inverter 242 are substantially the same. The second unit 2422 can also achieve the same technical effect of maintaining the potential of the first node Qn as the first unit 2421.

Compared with the prior art in FIG. 1, two inverters are used to connect the two output nodes Pn and Kn to control two voltage stabilizing units respectively. The GOA circuit unit provided in an embodiment of the present disclosure controls the eighth thin film transistor T8 of the voltage stabilizing unit 241 only by outputting a potential signal of the second node Kn to achieve maintenance of the potential of the first node Qn. This optimizes a structure of the GOA circuit unit and effectively simplifies a number of thin film transistors, thereby reducing space occupied by the GOA circuit unit, which is beneficial to reducing a width of a frame of a display panel. Simultaneously feeding the first clock signal LC1 and the nth stage clock signal CKn separately can effectively reduce time when the second thin film transistor T2 and the third thin film transistor T3 receive forward current stress. Therefore, offset of threshold voltage of the second thin film transistor T2 and the third thin film transistor T3 is reduced, stability of the thin film transistor is improved, and a scan signal waveform output is normal.

In the nth (n is greater than 4 and n is a positive integer) stage GOA circuit unit, the pull-up control circuit module 21 is connected to the first node Qn and is configured to receive a n–4th stage transmission signal STn–4 and a n–4th stage scan signal Gn–4 to generate a current stage scan signal and output the current stage scan signal to the first node Qn.

The pull-up circuit module 22 is connected to the first node Qn and a nth stage scan signal output terminal Gn and is configured to receive the nth stage clock signal CKn. The pull-up circuit module 22 is configured to output a high-level signal of the nth stage clock signal CKn to the nth stage scan signal output terminal Gn when a potential of the first node Qn is high.

The pull-down circuit module 23 is connected to the first node Qn, the nth stage scan signal output terminal Gn, the first power low-voltage signal terminal VSS1 and the second power low-voltage signal terminal VSS2, and is configured to receive a n+4th stage scan signal Gn+4. The pull-down circuit module is configured to output a first low-level signal provided by the first power low-voltage signal terminal VSS1 to the nth stage scan signal output terminal Gn according to the n+4th stage scan signal Gn+4.

The signal conversion circuit module 25 is configured to receive the nth stage clock signal CKn and output a nth stage transmission signal STn according to the nth stage clock signal CKn.

In an embodiment of the present disclosure, the pull-up control circuit module in the GOA circuit unit of the first to fourth stages in the GOA circuit is configured to receive a circuit start signal STV. The pull-up control circuit module in the GOA circuit unit from the last fourth to the last first stages of the GOA circuit is similarly configured to receive the circuit start signal.

In an embodiment of the present disclosure, each stage of the GOA circuit unit further includes a bootstrap capacitor Cb. Both terminals of the bootstrap capacitor Cb are respectively connected to the first node Qn and the nth scan signal output terminal Gn and are configured to generate a high level of the nth stage scan signal.

In an embodiment of the present disclosure, the thin film transistors in the GOA circuit are all amorphous silicon thin film transistors. Of course, in some embodiments, the thin film transistor in the GOA circuit may also be an indium gallium zinc oxide thin film transistor or both are included, which is not limited herein.

Beneficial effect of embodiments of the present disclosure: in a GOA circuit of embodiments of the present disclosure, a first clock signal, a second clock signal, and a nth stage clock signal are separated into an input terminal of a first unit and an input terminal of a second unit. This reduces time that thin film transistors in the first unit and the second unit are subjected to forward current stress, thereby reducing offset of threshold voltages of the thin film transistors, improving stability of the thin film transistors, and ensuring a normal output of a scan signal waveform. In addition, the first thin film transistor is used to connect the first unit and the second unit to the second node, so as to effectively simplify a number of thin film transistors, thereby reducing space occupied by the GOA circuit.

An embodiment of the present disclosure further provides a display panel comprising a plurality of rows of pixels and the GOA circuit as provided in the above embodiment. Each row of the pixels is connected to a corresponding GOA circuit unit in the GOA circuit and is driven by the GOA circuit unit. The display panel provided by the embodiment of the present disclosure can achieve the same technical effects as the GOA circuit provided by the above embodiment and will not be described here.

In summary, although the present disclosure is disclosed as above with preferred embodiments, the above preferred embodiments are not intended to limit the present disclosure. Those of ordinary skill in the art can make various changes and modifications without departing from the spirit and scope of the present disclosure, so the protection scope of the present disclosure is based on the scope defined by the claims.

What is claimed is:

1. A gate driver on array (GOA) circuit, comprising:
   a plurality of cascaded GOA circuit units, wherein a nth stage GOA circuit unit comprises a pull-down maintenance circuit module, a power supply low-voltage signal terminal, and a first node, where n is greater than 4 and n is a positive integer, the pull-down maintenance circuit module comprises:
   an inverter comprising a first unit, a second unit, and a first thin film transistor, wherein the first unit and the second unit comprise a plurality of thin film transistors, a gate of the first thin film transistor is connected to the first node, a first terminal of the first thin film transistor is connected to the power supply low-voltage signal terminal, a second terminal of the first thin film transistor, the first unit, and the second unit are connected to a second node, an input terminal of the first unit is connected to a first clock signal and a nth stage clock signal, and an input terminal of the second unit is connected to a second clock signal and the nth stage clock signal; and
   a voltage stabilizing unit connected to the power supply low-voltage signal terminal and an output node, wherein the inverter uses a potential of the first node as an input signal and uses a potential of the second node as an output signal to control the voltage stabilizing unit to stabilize the potential of the first node;
   wherein the first clock signal and the nth stage clock signal are separated into the input terminal of the first unit and/or the second clock signal and the nth stage clock signal are separated into the input terminal of the second unit to stabilize the potential of the first node.

2. The GOA circuit according to claim 1, wherein the first unit comprises a second thin film transistor and a third thin film transistor, the second unit comprises a fourth thin film transistor and a fifth thin film transistor, a gate of the second thin film transistor is connected to the first clock signal, a gate of the fourth thin film transistor is connected to the second clock signal, a first terminal of the second thin film transistor, a first terminal of the third thin film transistor, a first terminal of the fourth thin film transistor, and a first terminal of the fifth thin film transistor are connected to the nth stage clock signal, and a second terminal of the third thin film transistor and a second terminal of the fifth thin film transistor are connected to the second node.

3. The GOA circuit according to claim 2, wherein the first unit further comprises a sixth thin film transistor, and the second unit further comprises a seventh thin film transistor, a gate of the sixth thin film transistor and a gate of the seventh thin film transistor are connected to the first node, a first terminal of the sixth thin film transistor is connected to a second terminal of the second thin film transistor and a gate of the third thin film transistor, a first terminal of the seventh thin film transistor is connected to a second terminal of the fourth thin film transistor and a gate of the fifth thin film transistor, and a second terminal of the sixth thin film transistor and a second terminal of the seventh thin film transistor are connected to the power supply voltage signal terminal.

4. The GOA circuit according to claim 3, wherein the voltage stabilizing unit comprises an eighth thin film transistor, a gate of the eighth thin film transistor is connected to the second node, and a first terminal of the eight thin film transistor is connected to the power supply low-voltage signal terminal, and a second terminal of the eighth thin film transistor is connected to the first node.

5. The GOA circuit according to claim 1, wherein the first clock signal and the second clock signal have opposite phases.

6. The GOA circuit according to claim 1, wherein each stage of the GOA circuit unit comprises a pull-up control circuit module, a pull-up circuit module, a signal conversion circuit module, and a pull-down circuit module, in the nth stage GOA circuit unit:
   the pull-up control circuit module is connected to the first node and is configured to receive a n-4th stage transmission signal and a n-4th stage scan signal;
   the pull-up circuit module is connected to the first node and a nth stage scan signal output terminal and is configured to receive the nth stage clock signal;
   the signal conversion circuit module is configured to receive the nth stage clock signal and output the nth stage transmission signal;
   the pull-down circuit module is connected to the first node, the nth stage scan signal output terminal and the power low-voltage signal terminal and is configured to receive a n+4th stage scan signal.

7. The GOA circuit according to claim 6, wherein in first stage to fourth stage GOA circuit units, the pull-up control circuit unit is configured to receive a circuit start signal.

8. The GOA circuit according to claim 6, wherein the GOA circuit unit further comprises a bootstrap capacitor connected to the first node and the nth scan signal output terminal.

9. The GOA circuit according to claim 1, wherein the thin film transistor in the GOA circuit is at least one of an amorphous silicon thin film transistor and an indium gallium zinc oxide thin film transistor.

10. A display panel, comprising:
    a plurality of rows of pixels and a GOA circuit, the GOA circuit comprising a plurality of cascaded GOA circuit units, wherein each row of the pixels is connected to a corresponding GOA circuit unit in the GOA circuit and is driven by the GOA circuit unit, a nth stage GOA circuit unit comprises a pull-down maintenance circuit module, a power supply low-voltage signal terminal, and a first node, where n is greater than 4 and n is a positive integer, the pull-down maintenance circuit module comprises:

an inverter comprising a first unit, a second unit, and a first thin film transistor, wherein the first unit and the second unit comprise a plurality of thin film transistors, a gate of the first thin film transistor is connected to the first node, a first terminal of the first thin film transistor is connected to the power supply low-voltage signal terminal, a second terminal of the first thin film transistor, the first unit, and the second unit are connected to a second node, an input terminal of the first unit is connected to a first clock signal and a nth stage clock signal, and an input terminal of the second unit is connected to a second clock signal and the nth stage clock signal; and a voltage stabilizing unit connected to the power supply low-voltage signal terminal and an output node, wherein the inverter uses a potential of the first node as an input signal and uses a potential of the second node as an output signal to control the voltage stabilizing unit to stabilize the potential of the first node;

wherein the first clock signal and the nth stage clock signal are separated into the input terminal of the first unit and/or the second clock signal and the nth stage clock signal are separated into the input terminal of the second unit to stabilize the potential of the first node.

11. The display panel according to claim 10, wherein the first unit comprises a second thin film transistor and a third thin film transistor, the second unit comprises a fourth thin film transistor and a fifth thin film transistor, a gate of the second thin film transistor is connected to the first clock signal, a gate of the fourth thin film transistor is connected to the second clock signal, a first terminal of the second thin film transistor, a first terminal of the third thin film transistor, a first terminal of the fourth thin film transistor, and a first terminal of the fifth thin film transistor are connected to the nth stage clock signal, and a second terminal of the third thin film transistor and a second terminal of the fifth thin film transistor are connected to the second node.

12. The display panel according to claim 11, wherein the first unit further comprises a sixth thin film transistor, and the second unit further comprises a seventh thin film transistor, a gate of the sixth thin film transistor and a gate of the seventh thin film transistor are connected to the first node, a first terminal of the sixth thin film transistor is connected to a second terminal of the second thin film transistor and a gate of the third thin film transistor, a first terminal of the seventh thin film transistor is connected to a second terminal of the fourth thin film transistor and a gate of the fifth thin film transistor, and a second terminal of the sixth thin film transistor and a second terminal of the seventh thin film transistor are connected to the power supply voltage signal terminal.

13. The display panel according to claim 12, wherein the voltage stabilizing unit comprises an eighth thin film transistor, a gate of the eighth thin film transistor is connected to the second node, and a first terminal of the eight thin film transistor is connected to the power supply low-voltage signal terminal, and a second terminal of the eighth thin film transistor is connected to the first node.

14. The display panel according to claim 10, wherein the first clock signal and the second clock signal have opposite phases.

15. The display panel according to claim 10, wherein each stage of the GOA circuit unit comprises a pull-up control circuit module, a pull-up circuit module, a signal conversion circuit module, and a pull-down circuit module, in the nth stage GOA circuit unit:

the pull-up control circuit module is connected to the first node and is configured to receive a n-4th stage transmission signal and a n-4th stage scan signal;

the pull-up circuit module is connected to the first node and a nth stage scan signal output terminal and is configured to receive the nth stage clock signal;

the signal conversion circuit module is configured to receive the nth stage clock signal and output the nth stage transmission signal;

the pull-down circuit module is connected to the first node, the nth stage scan signal output terminal and the power low-voltage signal terminal and is configured to receive a n+4th stage scan signal.

16. The display panel according to claim 15, wherein in first stage to fourth stage GOA circuit units, the pull-up control circuit unit is configured to receive a circuit start signal.

17. The display panel according to claim 15, wherein the GOA circuit unit further comprises a bootstrap capacitor connected to the first node and the nth scan signal output terminal.

18. The display panel according to claim 10, wherein the thin film transistor in the GOA circuit is at least one of an amorphous silicon thin film transistor and an indium gallium zinc oxide thin film transistor.

19. A display panel, comprising:

a plurality of rows of pixels and a GOA circuit, the GOA circuit comprising a plurality of cascaded GOA circuit units, wherein each row of the pixels is connected to a corresponding GOA circuit unit in the GOA circuit and is driven by the GOA circuit unit, a nth stage GOA circuit unit comprises a pull-down maintenance circuit module, a power supply low-voltage signal terminal, and a first node, where n is greater than 4 and n is a positive integer, the pull-down maintenance circuit module comprises:

an inverter comprising a first unit, a second unit, and a first thin film transistor, the first unit comprises a second thin film transistor and a third thin film transistor, the second unit comprises a fourth thin film transistor and a fifth thin film transistor, a gate of the first thin film transistor is connected to the first node, a first terminal of the first thin film transistor is connected to the power supply low-voltage signal terminal, a gate of the second thin film transistor is connected to the first clock signal having a phase opposite to a phase of the first clock signal, a first terminal of the second thin film transistor, a first terminal of the third thin film transistor, a first terminal of the fourth thin film transistor, and a first terminal of the fifth thin film transistor are connected to the nth stage clock signal, and a second terminal of the third thin film transistor, a second terminal of the fifth thin film transistor, and a second terminal of the first thin film transistor are connected to the second node; and a voltage stabilizing unit connected to the power supply low-voltage signal terminal and an output node, wherein the inverter uses a potential of the first node as an input signal and uses a potential of the second node as an output signal to control the voltage stabilizing unit to stabilize the potential of the first node;

wherein the first clock signal and the nth stage clock signal are separated into the input terminal of the first unit and/or the second clock signal and the nth stage clock signal are separated into the input terminal of the second unit to stabilize the potential of the first node.

20. The display panel according to claim 19, wherein the first unit further comprises a sixth thin film transistor, and the second unit further comprises a seventh thin film transistor, a gate of the sixth thin film transistor and a gate of the seventh thin film transistor are connected to the first node, a first terminal of the sixth thin film transistor is connected to a second terminal of the second thin film transistor and a gate of the third thin film transistor, a first terminal of the seventh thin film transistor is connected to a second terminal of the fourth thin film transistor and a gate of the fifth thin film transistor, and a second terminal of the sixth thin film transistor and a second terminal of the seventh thin film transistor are connected to the power supply voltage signal terminal.

\* \* \* \* \*